(12) United States Patent
Oppelt

(10) Patent No.: US 6,573,788 B2
(45) Date of Patent: Jun. 3, 2003

(54) AMPLIFIER DEVICE WITH FREQUENCY-RESPONSE-COMPENSATING AMPLIFIER REACTANCE, AND USE OF THE AMPLIFIER DEVICE

(75) Inventor: Ralph Oppelt, Uttenreuth (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/908,247

(22) Filed: Jul. 18, 2001

(65) Prior Publication Data

US 2002/0041205 A1 Apr. 11, 2002

(30) Foreign Application Priority Data

Jul. 20, 2000 (DE) .......................... 100 35 269

(51) Int. Cl.[7] .......................... H03F 15/00; H03H 11/00
(52) U.S. Cl. ...................................... 330/61 A; 333/213
(58) Field of Search ............... 330/61 A, 174, 330/292; 333/213; 4/217

(56) References Cited

U.S. PATENT DOCUMENTS

| | | | |
|---|---|---|---|
| 4,285,010 A | 8/1981 | Wilcox | .......................... 358/112 |
| 5,373,741 A | 12/1994 | Volksmann et al. | ............ 73/602 |
| 5,565,812 A | * 10/1996 | Soenen | ........................ 327/165 |
| 5,617,064 A | * 4/1997 | Gorecki | ........................ 333/213 |
| 5,879,303 A | 3/1999 | Averkiou et al. | ............ 600/447 |
| 6,075,309 A | 6/2000 | Wu | .............................. 310/319 |
| 6,201,446 B1 | * 3/2001 | Ananth | ........................ 330/292 |

FOREIGN PATENT DOCUMENTS

EP   0264812   4/1988

OTHER PUBLICATIONS

German–language article by J. Koch, "Piezoxide–Wandler", pp. 156–159, Mar. 1973.

\* cited by examiner

Primary Examiner—Robert Pascal
Assistant Examiner—Khanh Van Nguyen
(74) Attorney, Agent, or Firm—Baker Botts LLP

(57) ABSTRACT

The amplifier device serves the purpose of broadband amplification of an electric input signal fed from a signal source. It has an amplifier input for feeding the input signal, and a broadband amplifier element. Provided for the purpose of compensating a source reactance active at a source output is an amplifier reactance which is active at the amplifier input and is determined by an input impedance of a current-reversing negative impedance converter. The useful bandwidth for the input signal is raised thereby.

12 Claims, 2 Drawing Sheets

AMPLIFIER DEVICE WITH FREQUENCY-RESPONSE-COMPENSATING AMPLIFIER REACTANCE, AND USE OF THE AMPLIFIER DEVICE

FIELD OF THE INVENTION

The invention relates to an amplifier device for broadband amplification of an electric input signal fed from a signal source, the amplifier device comprising at least one broad band amplifier element with an amplifier input for feeding the input signal. Such an amplifier device is known from U.S. Pat. No. 5,373,741. The invention further relates to the use of such an amplifier device.

BACKGROUND OF THE INVENTION

Such an amplifier device is used, for example, as a preamplifier of an ultrasonic device. In this case, an electric input signal, which is generated, for example, by an ultrasonic transducer from a received acoustic signal and which can, in particular, have a very low signal level, is amplified in the amplifier device for a downstream signal processing (not described in more detail here). In the receive mode, the ultrasonic transducer constitutes a signal source for the electric input signal to be amplified by the amplifier device. This amplification should be performed over as broad a band as possible in order not to diminish the information content unnecessarily. The broader the band over which an ultrasonic device which works using the pulse-echo method is operated, the shorter is the time duration which can thereby be achieved for the pulse response received from an object to be examined. The spatial resolution, and thus the imaging quality also rise with the temporal resolution.

U.S. Pat. No. 5,879,303 discloses a specific imaging method for an ultrasonic device. In this so-called THI (Tissue Harmonic Imaging) method, the first harmonic of the received acoustic signal is also evaluated in addition. This first harmonic is the second harmonic of a fundamental frequency of the sound signal irradiated into the object to be examined. It is formed because of a non-linearity of the human tissue provided in this case as the object to be examined. An amplifier device used in the receiver branch in this context should therefore be designed to cover sufficient bandwidth in order still to amplify the first harmonic without falsification. The fundamental frequency for an ultrasonic device currently in conventional use in medical technology is of the order of magnitude of a few megahertz.

As a rule, a piezoelectric electroacoustic transducer is used. In the case of reception, it is typified, inter alia, by a capacitor connected in parallel with the electroacoustic transducer output. An amplifier device such as described in the text book entitled *"Piezoxide-Wandler"* [Piezoxide Transducers"] by J. Koch, 1973, Valvo GmbH Hamburg, Pages 157 and 158, or else in U.S. Pat. No. 4,285,010 is currently being used in order to compensate the influence of this parallel capacitor on the frequency response. In the case of this amplifier device, the influence of the parallel capacitor of the ultrasonic transducer is at least partially compensated by means of an inductor connected in series or parallel with the electroacoustic transducer output or the amplifier input. Overall, however, there is still always one frequency response exhibiting the bandpass response. The consequence of this is that a frequency component situated widely distant from the fundamental frequency is strongly damped in the amplifier device. Usually, a relative bandwidth (=bandwidth related to a center or fundamental frequency) of approximately 100% is achieved with the known amplifier device. It is thereby possible to operate an electroacoustic transducer with a fundamental frequency, of, for example, 3 MHz, for example in the range from 1.5 to 4.5 MHz.

A broadband amplifier device for a video head is described in EP 0 264 812 A2. An amplifier element with positive feedback is used in the amplifier device described.

U.S. Pat. No. 6,075,309 discloses a broadband electric shunt device for connecting to a piezoelectric resonator which is used to control the vibration of a structure. In this case, the piezoelectric resonator is arranged on the structure such that it is possible for the vibrations of this structure to be damped or controlled. The connection to the shunt device renders it possible to control vibration in a wide frequency range. For this purpose, a subcircuit of the shunt device is designed as a current-reversing negative impedance converter. The shunt device is passive. In particular, it is not connected electrically to another unit, nor does it make an amplified signal available.

SUMMARY OF THE INVENTION

The object of the invention is to specify an amplifier device of the type described at the beginning which permits broadband amplification of the input signal. The aim is also to specify a particularly advantageous use of the amplifier device.

An amplifier device corresponding to the features of patent claim 1 or of patent claim 6 is specified for the purpose of achieving the object relating to the device.

The amplifier device according to the invention for broadband amplification of an electric input signal fed from a signal source is a device comprising at least one broadband amplifier element with an amplifier input for feeding the input signal, and with an input impedance, active at the amplifier input, in the form of an amplifier reactance which serves to compensate a source reactance active at a source output;

the amplifier element in which case designed as a current-reversing negative impedance converter which comprises a broadband INIC amplifier element with a first and a second input, respectively, and with an output, the output is fed back via a first INIC impedance and via a second INIC impedance respectively to the first and the second input, respectively, and the second input is led to frame via a third INIC impedance; and the first input is simultaneously the amplifier input, and the output is simultaneously an amplifier output at which there is present an output signal generated from the input signal by means of amplification.

The amplifier device according to the invention for broadband amplification of an electric input signal fed from a signal source is, alternatively, a device comprising:

one broadband and high-resistance amplifier element with an amplifier input for feeding the input signal, and with an input impedance, active at the amplifier input, in the form of an amplifier reactance which serves to compensate a source reactance active at a source output; and one current-reversing negative impedance converter which is connected at the amplifier input in parallel with the broadband and high-resistance amplifier element, and whose INIC input impedance forms the amplifier reactance, in which the current-reversing negative impedance converter comprises a broadband INIC amplifier element with a first and a second input, and with an output, the output is fed back via a first INIC impedance and via a second INIC impedance respectively to the first and the second input, respectively, and the second input is led to frame via a third INIC impedance.

The invention is based in this case on the finding that the frequency response, determined decisively by the source reactance, of the signal source can be substantially more effectively compensated, that is to say smoothed, by an amplifier reactance which is provided in the amplifier device and determined by an input impedance of a current-reversing negative impedance converter, than by connecting a simple inductor, as is done in the prior art, for example in conjunction with a piezoelectric electroacoustic transducer. The compensation by means of the amplifier reactance according to the invention is not based in this case on a resonant tuning, which always leads to a bandpass response and thus to a useful bandwidth which is, as before, relatively restricted. By contrast, the influence of the source reactance and the influence of the amplifier reactance on the frequency response largely cancel one another out, at least within a useful bandwidth. In the ideal case of complete compensation, what is thereby achieved is a response as if the source reactance were not present at all.

This raises the useful bandwidth of the input signal, and an output signal amplified over a very broad band is obtained at the output of the amplifier device. In this case, broad band is understood as a useful bandwidth whose upper cutoff frequency is at least double, in particular at least three times the value of a fundamental frequency of the input signal. The upper cutoff frequency can even rise without difficulty up to over fifty times the fundamental frequency with the aid of the amplifier reactance according to the invention.

The current-reversing negative impedance converter used in the amplifier device is also denoted by INIC. The leading "I" stands in this case for a current reversal brought about by this arrangement, and the remainder is an abbreviation for the English term "Negative Impedance Converter". Any desired negative impedance can be generated with the aid of an appropriately dimensioned INIC. Consequently, INIC is particularly good for use in the broadband amplifier device, since an amplifier reactance which has precisely the opposite sign to the source reactance is provided for expanding the useful frequency band.

The current-reversing negative impedance converter includes a broadband INIC amplifier element which is designed, for example, in the form of an operational amplifier. The broadband design ensures that, in conjunction with the signal source, the amplifier device has a broad useful frequency range overall. The INIC amplifier element has a first and a second input as well as an output, which is fed back to the first and the second inputs by a first INIC impedance and by a second INIC impedance, respectively. However, the second input is connected to frame by a third INIC impedance. The current-reversing negative impedance converter generates the desired amplifier reactance with the aid of this circuit.

In the first alternative as claimed in patent claim 1, the current-reversing negative impedance converter serves simultaneously as amplifier reactance and as broadband amplifier element. The input impedance of the current-reversing negative impedance converter compensates the source reactance. At the same time, a signal which is proportional to the input signal can be tapped at the output of the INIC amplifier element. The proportionality factor is given in this case by the desired gain. The amplifier device then manages with a very low number of individual components, and can therefore be produced cost-effectively.

In the second alternative as claimed in patent claim 6, in which the current-reversing negative impedance converter is connected at the amplifier input in parallel with a broadband amplifier element, this additional amplifier element is preferably designed with a high resistance. In this context, an amplifier element is of high resistance when, at least within the useful bandwidth, the absolute value of its input impedance is greater at least by the factor 5, in particular at least by the factor 10, than the absolute value of the amplifier reactance, which is formed by the input impedance of the current-reversing negative impedance converter. This broadband and high-resistance amplifier element carries out the actual amplification of the input signal after the compensation of the frequency response by the current-reversing negative impedance converter. Owing to the high-resistance embodiment, the signal source is not subjected to a load. This has a favorable influence on the frequency response particularly in the case of a signal source designed as a piezoelectric electroacoustic transducer, since a series resonant circuit of the electroacoustic transducer is then de-energized, and therefore exerts no influence on the frequency response.

A source impedance (=output impedance of the signal source) can be determined at the output of the signal source. The source reactance to be compensated can now be either equal to or else a fraction of this source impedance. The effectiveness at the source output means that the source reactance can be connected in parallel, or else in series with the source output. The source reactance can be of capacitive or inductive design, or else assume a desired mixed form, for example that of an undamped resonant circuit.

As in the complex calculation of alternating current, reactance is generally understood here as the imaginary part of a complex impedance $Z=R+jX$. The real part R is denoted as active resistance or resistance, and the imaginary part X as reactive resistance, impedance or simply as reactance. A distinction can be made between the two basic types of an inductive and a capacitive reactance $X_L$ and $X_C$, respectively. Their calculated values are $X_L=2\pi fL$ and $X_C=-1/2\pi fC$, respectively, given an inductance value L, a capacitance value C and the frequency f. They differ from one another both in sign and in the structure of their frequency dependence (proportional or inversely proportional to the frequency f).

Strictly speaking, therefore, compensation is achieved only for a single frequency value in the course of the known resonant tuning, in the case of which a capacitive source reactance is connected to an inductive amplifier reactance. By contrast therewith, an amplifier reactance in the form of an INIC input impedance even leads in an ideal case to compensation at all frequencies.

Advantageous refinements of the amplifier device in accordance with the invention follow from the dependent claims.

In an advantageous embodiment, the amplifier reactance and the source reactance respectively have the same absolute value. This equality holds for all frequencies in the ideal case, but at least within the useful bandwidth. This then yields a very good compensation of the source reactance, and a high useful overall bandwidth of the amplifier device results.

A favorable embodiment is one in which the first and the second INIC impedances are of purely capacitive design. The frequency response of the first and the second INIC impedances then cancel one another out and no longer contribute to the overall frequency response. Moreover, capacitively designed first and second INIC impedances make no contribution of their own to the noise of the amplifier device. The design of the third INIC impedance is governed by the source reactance to be compensated. It can be both of inductive and of capacitive design.

The amplifier device can be used with particular advantage in an ultrasonic device because of the high frequency bandwidth that can be achieved. It then serves, in particular, as a preamplifier which preamplifies an input signal generated by an ultrasonic transducer, particularly over a broad band for further processing in the ultrasonic device. The ultrasonic transducer supplying the input signal then constitutes the signal source. In particular, what is termed a static parallel capacitance of the ultrasonic transducer decisively determines the reactive fraction of the output impedance of the ultrasonic transducer, which is compensated by the amplifier reactance. The parallel capacitance therefore constitutes the source reactance to be compensated.

In principle, however, the amplifier device can also be used for the connection of another signal source. In particular, this signal source can also be an (ideal) current source with a parallel reactance. Also possible is an (ideal) voltage source with a series reactance.

BRIEF DESCRIPTION OF THE DRAWINGS

Preferred exemplary embodiments of the amplifier device according to the invention will now be explained in more detail with the aid of the drawing. For the purposes of illustration, the drawing is not done to scale, and certain features are illustrated schematically. In detail, FIGS. 1 and 2 respectively show an amplifier device, connected to a signal source, with a frequency-response-compensating amplifier reactance.

Parts corresponding to one another are provided in FIGS. 1 to 6 with the same reference symbols.

DETAIL DESCRIPTION OF THE INVENTION

Figure 1:
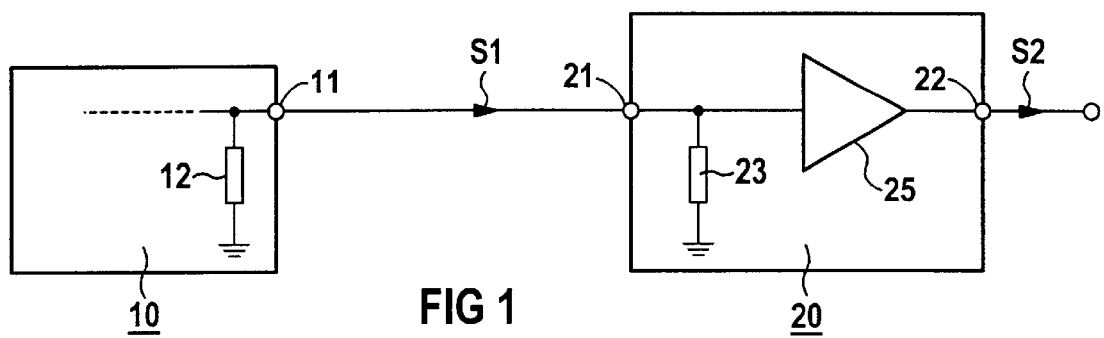

A broadband amplifier device 20 for amplifying an electric input signal S1 is illustrated in FIG. 1. An output signal S2, which can be tapped at an amplifier output 22 is generated in the amplifier device 20, from the input signal S1 fed in via an amplifier input 21. The input signal S1 is generated by a signal source 10. The amplifier input 21 is connected in an electrically conducting fashion to a source output 11 of the signal source 10. The amplifier device 20 particularly serves the broadband amplification of the input signal S1. An output, or else source impedance of the signal source 10 has a reactive fraction, which is symbolized in FIG. 1 by a source reactance 12.

The source reactance 12 makes a substantial contribution to limiting the useful frequency bandwidth. Provision is therefore made in the amplifier device 20 of an amplifier reactance 23 with a structurally identical frequency response and opposite sign to the source reactance 12. In this case, the term structurally identical frequency response also includes, in particular, an identical frequency dependence of the source reactance 12 and amplifier reactance 23 within the useful bandwidth. The amplifier reactance 23 then largely compensates the influence of the source reactance 12. The result is a smooth frequency characteristic with a substantially higher useful frequency bandwidth than in the case of the known resonant compensation of the source reactance 12. In the case of this conventional compensation method, the influence of the source reactance 12 and an amplifier reactance (not illustrated) cancel one another out only at a single frequency, specifically the resonant frequency. The result of this overall is a bandpass response. By contrast, the effect of the compensation by the amplifier reactance 23 is that the influences of the source reactance 12 and the amplifier reactance 23 cancel one another out over a wide frequency range, in the ideal case over the complete frequency range. This results in an amplified output signal S2 with a very high useful frequency bandwidth. The upper cutoff frequency can be raised in this way by a factor of up to 50, for example.

Figure 2:
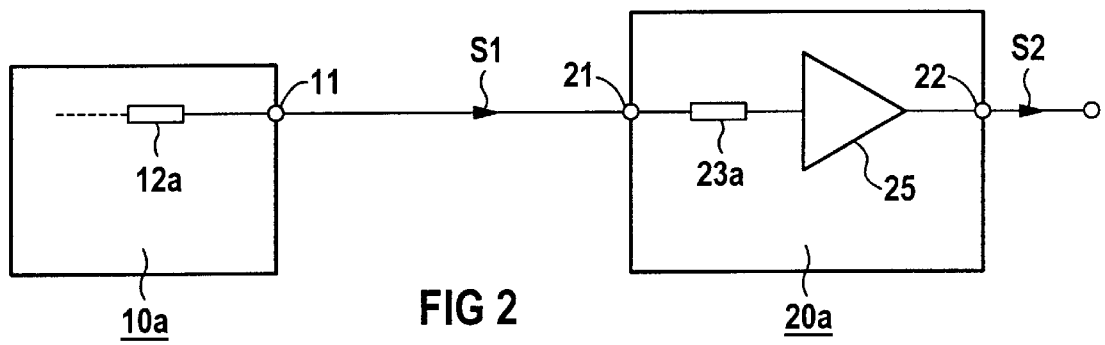

The signal source 10 of FIG. 1 has a source reactance 12 connected in parallel with the source output 11. The amplifier reactance 23 provided for compensation in the amplifier device 20 is then also correspondingly connected in parallel with the amplifier input 21. By contrast, FIG. 2 shows an amplifier device 23 and a signal source 10a with a different connection of the source output 11 and the amplifier input 21. Here, a source reactance 12a is connected in series with the source output 11 and, correspondingly, a compensating amplifier reactance 23a with, in turn, a structurally identical frequency response and opposite sign to the source reactance 12a is connected in series with the amplifier input 21. In a way similar to the case of the amplifier device 20 of FIG. 1, a very high useful bandwidth is produced with this circuit variant, as well.

Figure 3:
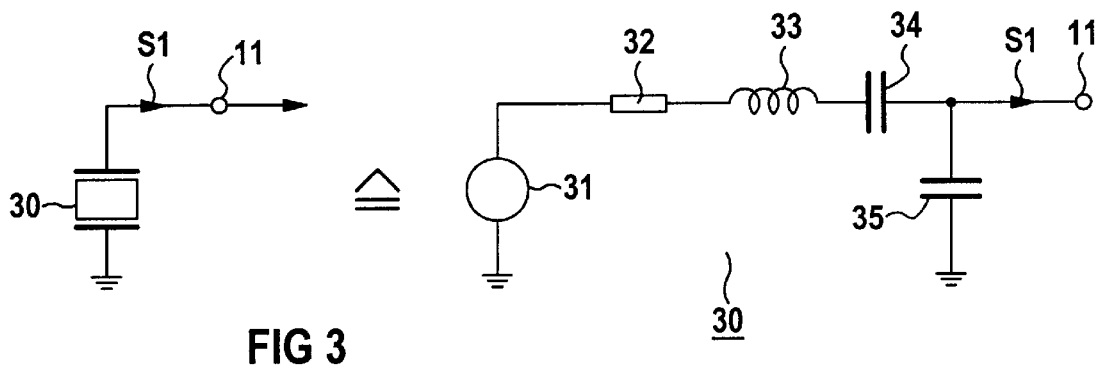
FIG. 3 shows an ultrasonic transducer and its electric equivalent circuit diagram as an example of a signal source.

An example of a signal source 10 according to FIG. 1 with an output impedance which has a parallel reactance is an ultrasonic transducer which is constructed with a piezoelectric body for electroacoustic and acoustoelectric conversion. Such an ultrasonic transducer 30 is illustrated in FIG. 3 together with the electric equivalent circuit diagram decisive for the case of reception. The ultrasonic transducer 30 uses a detected sound signal to generate the electric input signal S1 which can be tapped at the source output 11. The electric equivalent circuit diagram of the ultrasonic transducer 30 for the case of reception includes a voltage source 31 connected between a damped series resonant circuit and the system frame. The damped series resonant circuit comprises a series resistor 32, a series inductor 33 and a series capacitor 34. A parallel capacitor 35 is connected in parallel with the voltage source 31 and the damped series resonant circuit. This parallel capacitor 35 constitutes the source reactance 12 shown only schematically in FIG. 1. Its frequency influence and also that of the series resonant circuit is to be eliminated as far as possible by the amplifier reactance 23.

Figure 4:
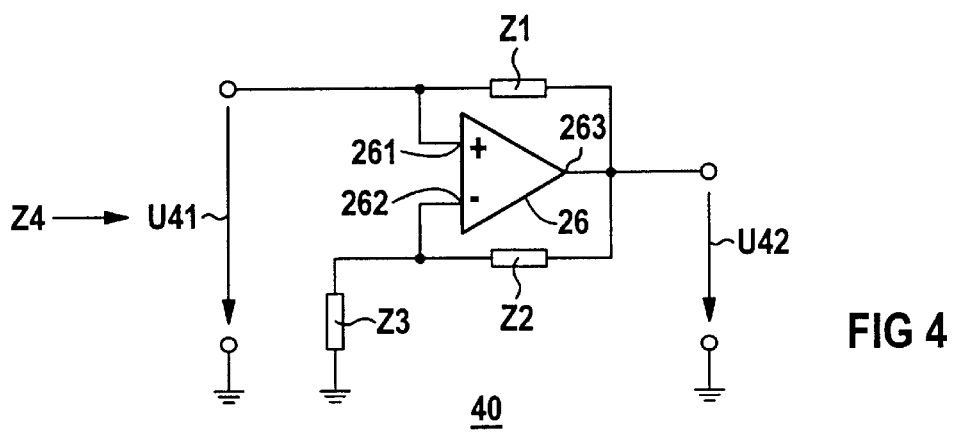
FIG. 4 shows a current-reversing negative impedance converter.

An exemplary embodiment of the amplifier reactance 23 is illustrated in FIG. 4. This is a current-reversing negative impedance converter 40, which is also designated by the abbreviation INIC. The current-reversing negative impedance converter 40 includes a broadband INIC amplifier element 26 with a first and second input 261 and 262, respectively, and an output 263. The output 263 is fed back to the first input 261 via a first INIC impedance Z1, and to the second input 262 via a second INIC impedance Z2. The second input 262 is, however, electrically connected to the system frame via a third INIC impedance Z3. The INIC amplifier element 26 is fashioned as an operational amplifier which is designed in accordance with the required frequency bandwidth and, also, the required background noise.

An analysis of the current-reversing negative impedance converter 40 illustrated in FIG. 4 can be undertaken with the aid of the assumptions, usually presupposed in the case of an operational amplifier of an infinitely high input impedance at the two inputs 261 and 262, and of an infinitely high voltage gain. An INIC input impedance Z4 is therefore yielded as:

$$Z4 = -Z3 \frac{Z1}{Z2} \quad (1)$$

Thus, in accordance with equation 1 the current-reversing negative impedance converter 40 has the desired negative INIC input impedance Z4. Its precise value is governed in this case by the INIC impedances Z1, Z2 and Z3. Their values can be dimensioned in accordance with the respective requirements for the specific application. The dimensioning is particularly simple when the first and second INIC impedances Z1 and Z2, respectively, are equal. In that case, only the third INIC impedance Z3 determines the INIC input impedance Z4.

A voltage gain from an INIC input voltage U41 and INIC output voltage U42 can also be determined for the current-reversing negative impedance converter 40. The INIC input voltage U41 is present at the first input 261, and the INIC output voltage U42 is tapped at the output 263. The voltage gain is calculated as:

$$\frac{U42}{U41} = 1 + \frac{Z2}{Z3} \quad (2)$$

The voltage gain is also set via the INIC impedances, although here only via the second and third INIC impedances Z2 and Z3, respectively. This value, as well, can therefore be dimensioned in accordance with the requirements.

Figure 5:
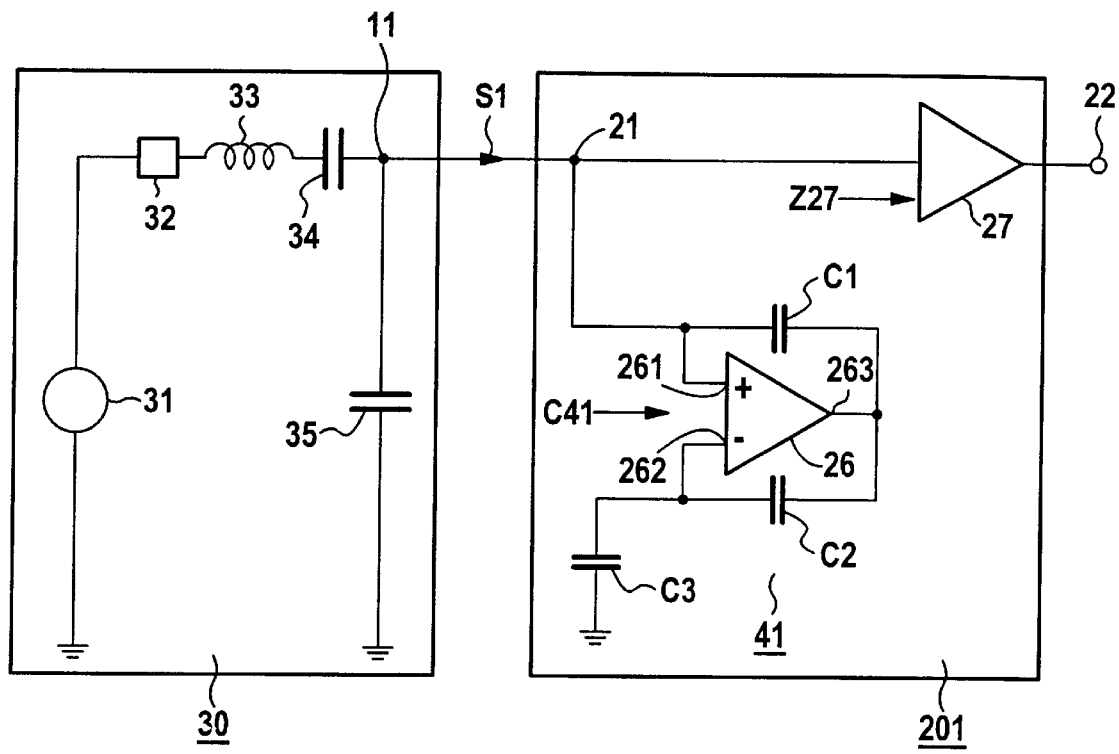
FIGS. 5 and 6 respectively show an amplifier device, connected to an ultrasonic transducer, with a current-reversing negative impedance converter.

Illustrated in FIG. 5 is an amplifier device 21 which serves to amplify an input signal S1 supplied by an ultrasonic transducer 30 in accordance with FIG. 3. A current-reversing negative impedance converter 41 is connected in the amplifier device 201 in parallel with the amplifier input 21 in order to compensate the parallel capacitor 35 of the ultrasonic transducer 30. The three INIC impedances Z1, Z2 and Z3 in FIG. 4 are designed in the exemplary embodiment of FIG. 5 as first INIC capacitor C1, as second INIC capacitor C2 and as third INIC capacitor C3, respectively. In accordance with the equation (1) this results in a purely capacitive INIC input impedance Z4. An INIC input capacitor C41 correspondingly assumes the value:

$$C41 = C3 \frac{C1}{C2} \quad (3)$$

The three INIC capacitors C1, C2 and C3 are then selected precisely so as to produce an INIC input capacitor C41 whose absolute value is equal to the parallel capacitor 35 of the ultrasonic transducer 30. As a result, the parallel capacitor 35 is compensated to zero for virtually all frequencies. In this case, as well, a particularly simple dimensioning results when the first and second INIC capacitors C1 and C2, respectively, are equal. The INIC input capacitor C41 is then fixed by the third INIC capacitor C3.

The amplifier device 201 also includes a broadband and high-resistance amplifier element 27 connected in parallel with the amplifier input 21. This element has, in particular, a very high input impedance Z27. In cooperation with the current-reversing negative impedance converter 41, in addition to the already mentioned frequency compensation of the parallel capacitor 35, the high-resistance input impedance Z27 has the effect that the damped series resonant circuit contained in the ultrasonic transducer 30 exerts no influence on the frequency response. Since there is no longer any active parallel capacitance relative to frame, it is also impossible for capacitive leakage current to flow off to frame. If, as in the example of FIG. 5, use is additionally made of a high-resistance amplifier element 27, neither does any current flow off to frame via this amplifier element 27. This means that the damped series resonant circuit is de-energized, and that no voltage drops either across the series inductor 33 nor across the series capacitor 34. However, this also means that the frequency influence of the damped series resonant circuit vanishes. The overall result is therefore a very high useful frequency bandwidth.

It is particularly advantageous when the amplifier element 27 is designed as an emitter follower. In addition to a high-resistance input impedance Z27, an emitter follower also ensures a low-noise amplification of the input signal S1. For amplification with as little noise as possible, it is favorable when an equivalent noise input resistance of the amplifier element 27 has as far as possible the same value as the series resistor 32. In the case of a currently customary ultrasonic transducer 30, the value of the series resistance varies within the range between 50 and 500Ω. An emitter follower can be dimensioned both with a high-resistance input impedance Z27 and with an equivalent noise input impedance whose value is in said range. A broadband and also low-noise amplification of the input signal S1 is thereby possible. A possibly finite capacitive fraction in the input impedance Z27 can also be compensated by means of an INIC input capacitor C41 which is of somewhat higher dimension than is required for simply compensating the parallel capacitor 35.

Figure 6:
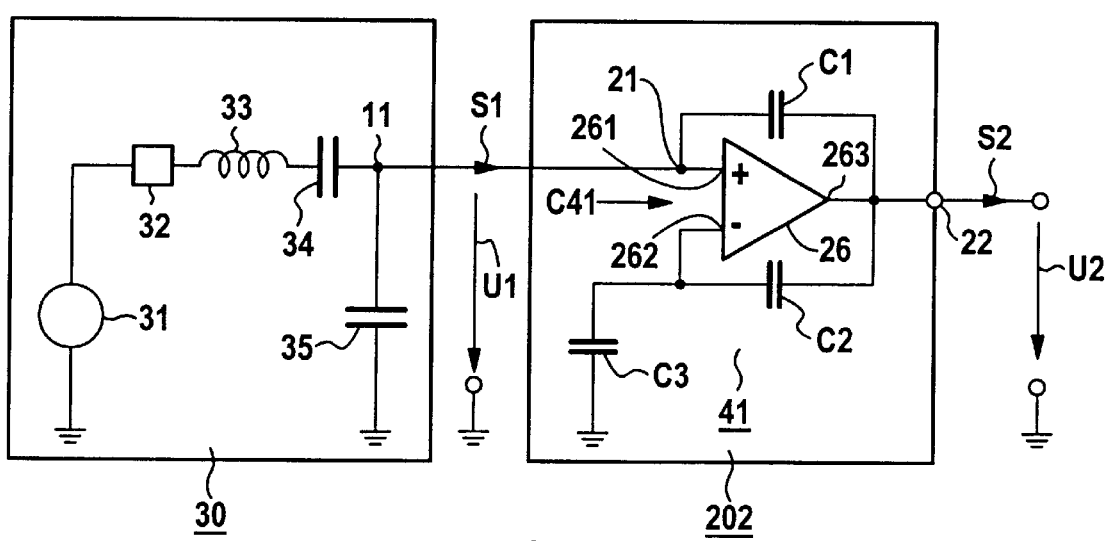

A further amplifier device 202 for amplifying an electric input signal S1 supplied by an ultrasonic transducer 30 is illustrated in FIG. 6. By contrast with the amplifier device 201 of FIG. 5, in the case of the amplifier device 202 the current-reversing negative impedance converter 41 forms both the amplifier reactance 23 and the amplifier element 25. The analysis of the current-reversing negative impedance converter 40 of FIG. 4 has shown that the current-reversing negative impedance converter 40 can also be used for voltage amplification. For this purpose, in accordance with FIG. 6 the output 263 of the INIC amplifier element 26 is used as amplifier output 22. A gain V of the amplifier device 202 is then calculated in accordance with equation (2) as:

$$V = \frac{U2}{U1} = 1 + \frac{C3}{C2}, \quad (4)$$

U1 denoting an amplifier input voltage, and U2 denoting an amplifier output voltage of the amplifier device 202. In accordance with equation (4) the gain V is, in particular, independent of frequency.

In the case of the amplifier device 202, as well, the negative INIC input capacitor C41 is connected in parallel with the amplifier input 21 and therefore leads to compensation of the parallel capacitor 35 of the ultrasonic transducer 30. In addition, the voltage-amplifying action of the current-reversing negative impedance converter 41 is also used.

The values prescribed in practice for the parallel capacitor 35 and the gain V are then opposed, with the first, the second and the third INIC capacitors C1, C2 and C3, respectively, by three at least largely freely selectable dimensioning parameters. This leaves an open degree of freedom for determining the INIC capacitance values. A simple design of the current-reversing negative impedance converter 41 is yielded, for example, by first and second INIC capacitors C1 and C2 (C1=C2), which are equally dimensioned. The remaining dimensioning is then performed via the equations (3) and (4).

An ohmic resistor (not illustrated) which is of very high resistance can be connected in parallel with the second INIC capacitor C2 in order to define the working point of the amplifier devices 201 and 202. Likewise, a high-resistance resistor can be connected to frame in parallel with the first INIC input 261 in order to define the working point of the INIC amplifier element 26. Both optionally provided resistors are, however, of such high resistance that their influence does not come to bear until outside the desired useful frequency bandwidth. Connection to the optionally provided resistors then does not lead to a worsening of the frequency response, nor of the noise response of the amplifier devices 201 and 202.

What is claimed is:

1. An amplifier device for broadband amplification of an electric input signal fed from a signal source comprising:

a broadband amplifier element with an amplifier input for feeding the input signal and with an input impedance, active at the amplifier input in the form of an amplifier reactance which serves to compensate a source reactance active at a source output, in which case the broadband amplifier element is designed as a current-reversing negative impedance converter which comprises a broadband INIC amplifier element with a first and a second input, respectively, and with an output, the output is fed back via a first INIC impedance and via a second INIC impedance respectively to the first and the second input, respectively, and the second input is led to ground via a third INIC impedance, and the first input is simultaneously the amplifier input, and the output is simultaneously an amplifier output at which there is present an output signal generated from the input signal by means of amplification.

2. The amplifier device as claimed in claim 1, in which the source reactance and the amplifier reactance are equal in terms of absolute value at least within the useful bandwidth.

3. The amplifier device as claimed in claim 2, in which the source reactance and the amplifier reactance have opposite signs at least within the useful bandwidth.

4. The amplifier device as claimed in claim 1, wherein the first and second INIC impedances are equal.

5. The amplifier device as claimed in claim 1, wherein the first and the second INIC impedances are respectively of purely capacitive design.

6. An ultrasonic device comprising the amplifier according to claim 1 as a preamplifier in which the signal source supplying the input signal is an ultrasonic transducer.

7. An amplifier device for broadband amplification of an electric input signal fed from a signal source comprising:

a broadband and high-resistance amplifier element with an amplifier input for feeding the input signal, and with an input impedance, active at the amplifier input, in the form of an amplifier reactance which serves to compensate a source reactance active at a source output, and a current-reversing negative impedance converter which is connected at the amplifier input in parallel with the broadband and high-resistance amplifier element, and whose INIC input impedance forms the amplifier reactance, in which the current-reversing negative impedance converter comprises a broadband INIC amplifier element with a first and a second input, respectively, and with an output, the output is fed back via a first INIC impedance and via a second INIC impedance respectively to the first and the second input, respectively, and the second input is led to ground via a third INIC impedance.

8. The amplifier device as claimed in claim 7, wherein the source reactance and the amplifier reactance are equal in terms of absolute value at least within a useful bandwidth.

9. The amplifier device as claimed in claim 8, wherein the source reactance and the amplifier reactance have opposite signs at least within the useful bandwidth.

10. The amplifier device as claimed in claim 7, wherein the first and the second INIC impedances are equal.

11. The amplifier device as claimed in claim 7, wherein the first and the second INIC impedances are in each case of purely capacitive design.

12. The use of the amplifier device in an ultrasonic device as claimed in claim 8, in which case a parallel capacitance of the ultrasonic transducer constitutes the source reactance to be compensated.

* * * * *